United States Patent
Kangas

(10) Patent No.: US 7,359,182 B2
(45) Date of Patent: Apr. 15, 2008

(54) PLUG-IN UNIT ASSEMBLY COMPRISING INSTRUMENT TRANSFORMERS

(75) Inventor: Simo Kangas, Vaasa (FI)

(73) Assignee: ABB Oy, Helsinki (FI)

( * ) Notice: Subject to any disclaimer, the term of this patent is extended or adjusted under 35 U.S.C. 154(b) by 477 days.

(21) Appl. No.: 10/507,415

(22) PCT Filed: Nov. 6, 2003

(86) PCT No.: PCT/FI03/00836

§ 371 (c)(1),
(2), (4) Date: Mar. 24, 2005

(87) PCT Pub. No.: WO2004/042751

PCT Pub. Date: May 21, 2004

(65) Prior Publication Data

US 2005/0162252 A1    Jul. 28, 2005

(30) Foreign Application Priority Data

Nov. 7, 2002    (FI) .................................. 20021999

(51) Int. Cl.
*H02B 1/01* (2006.01)
(52) U.S. Cl. .................................................. 361/627
(58) Field of Classification Search ................ 361/627, 361/636, 640, 641, 644, 663
See application file for complete search history.

(56) References Cited

U.S. PATENT DOCUMENTS

| 4,963,820 A | 10/1990 | Medlin | 324/142 |
| 5,834,932 A | 11/1998 | May | 324/107 |
| 5,923,526 A | 7/1999 | Kangas | 361/627 |
| 6,329,810 B1 | 12/2001 | Reid | 324/117 |

FOREIGN PATENT DOCUMENTS

| EP | 0 420 534 | 4/1991 |
| EP | 0 503 456 | 9/1991 |
| FR | 2745911 | 9/1997 |
| GB | 2 276 728 | 10/1994 |
| WO | 99/47935 | 9/1999 |

*Primary Examiner*—Javaid H. Nasri
(74) *Attorney, Agent, or Firm*—Dykema Gossett PLLC

(57) ABSTRACT

The invention relates to a plug-in unit assembly comprising instrument transformers, a case assembly (1) comprising a connector assembly (10), and a plug-in unit (2) comprising at least one instrument transformer (3, 4) and configured to be connected to the case assembly (1). The instrument transformers (3, 4) of the plug-in unit (2) are coded in such a manner that the codings of the current transformers (3) and the voltage transformers (4) are different. The connector assembly (10) of the plug-in unit assembly of the invention is capable of identifying the type of the instrument transformers (3, 4) and based on their coding when the plug-in unit (2) is being connected to the case assembly (1).

7 Claims, 6 Drawing Sheets

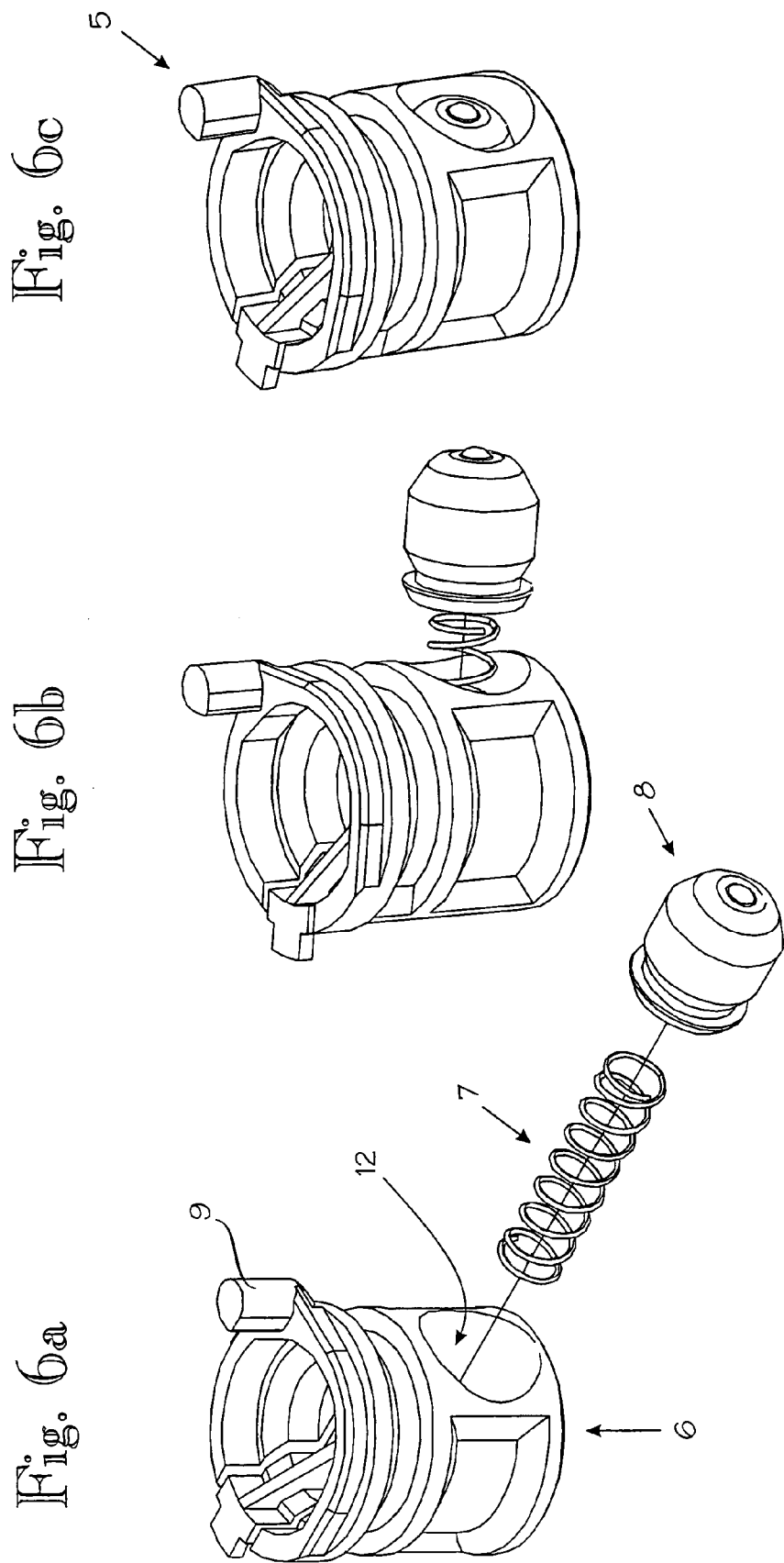

PLUG-IN UNIT ASSEMBLY COMPRISING INSTRUMENT TRANSFORMERS

CROSS-REFERENCE TO RELATED APPLICATIONS

The present application is a national phase of PCT/FI2003/000836, filed 6 Nov. 2003, which derived from Finland Application No. 20021999, filed 7 Nov. 2002. All priorities are claimed.

BACKGROUND OF THE INVENTION

The invention relates to plug-in unit assemblies comprising instrument transformers, and particularly to protective relay assemblies comprising a plug-in unit.

Different protective relay versions comprise a varying number of current and voltage transformers. Their connectors are subject to the requirement that the current circuits must close when the plug-in unit is being extracted, but, correspondingly, the voltage circuits must not short. In known solutions, a connector adapted to connect current and voltage transformers has to be assembled for each combination from different current and voltage connector components and, in addition, the modules have to be coded in order to prevent a module from being inserted into the wrong connection slot.

The problem in the above-described arrangement is that current and voltage transformers require different mating connectors. Another problem is the cost caused by the coding of modules. For example, if an assembly comprises six transformer slots having current or voltage transformers, the number of combinations is large, requiring an expensive mechanical coding system including set-ups and maintenance.

BRIEF DESCRIPTION OF THE INVENTION

The object of the invention is thus to provide a plug-in unit assembly comprising instrument transformers so as to solve the above problems. The object of the invention is achieved with an assembly, which is characterized in what is stated in the independent claim. Preferred embodiments of the invention are described in the dependent claims.

The invention is based on the current and voltage transformers using a similar connector, whereby the desired shorting of the current circuits when the plug-in unit is being extracted takes place on the basis of the coding of the instrument transformers of the plug-in unit.

The advantage of the plug-in unit assembly of the invention is that the current and voltage transformers are connectible to an identical connector. The use of an identical connector for both current and voltage transformers also enables lower costs.

BRIEF DESCRIPTION OF THE FIGURES

In the following, a preferred embodiment of the invention will be described in detail with reference to the accompanying drawings, in which

FIGS. 6a to 6c show the structure of the short-circuit element of the assembly of FIG. 1.

DETAILED DESCRIPTION OF THE INVENTION

Figure 1:
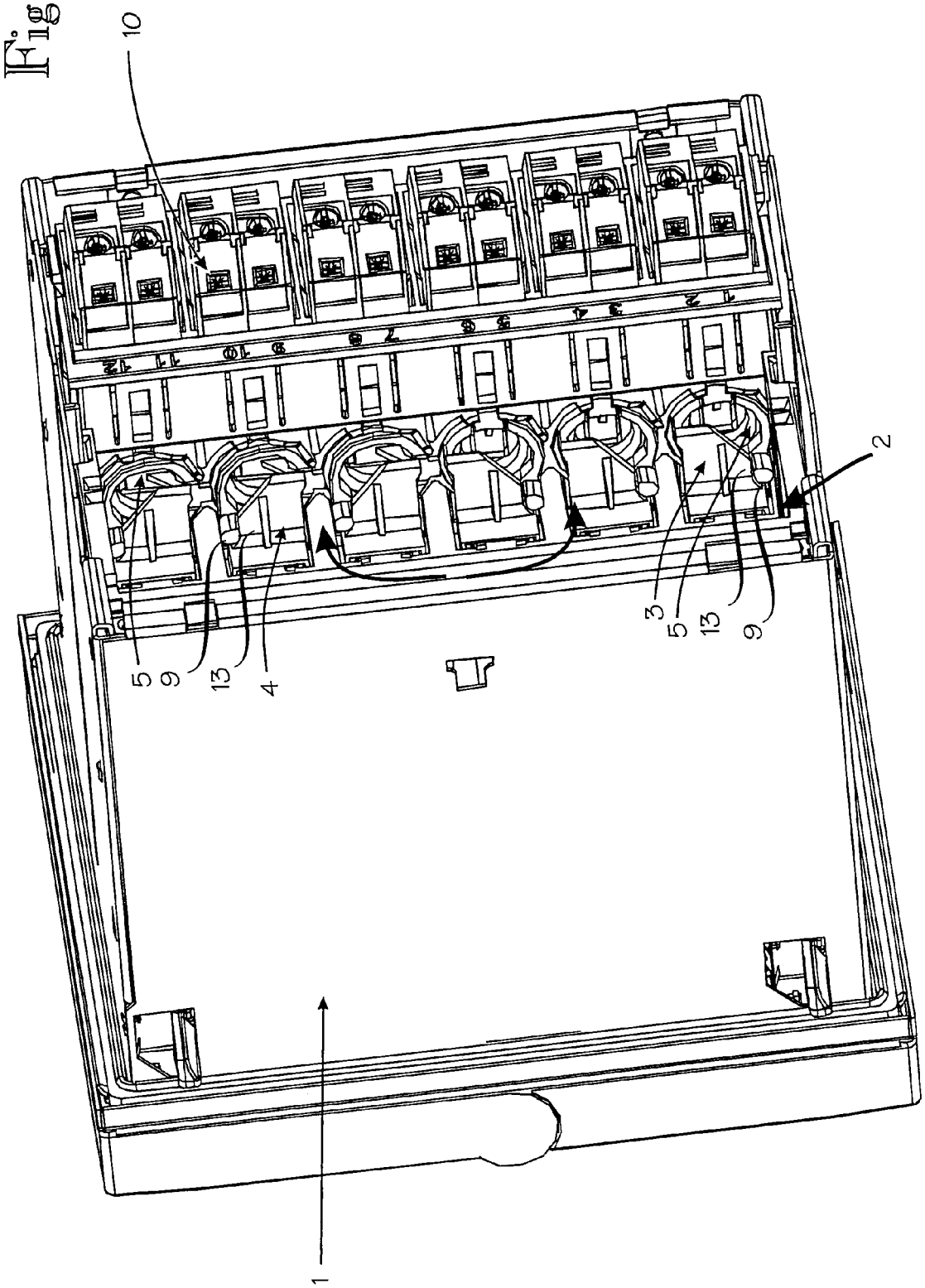
FIG. 1 shows an assembly according to an embodiment of the invention comprising instrument transformers, a case assembly and a plug-in unit.

The assembly of FIG. 1 comprises a case assembly 1 and a plug-in unit 2 configured for insertion therein. The case assembly 1 comprises a connector assembly 10, and the plug-in unit 2 comprises six instrument transformers configured for connection to the connector assembly 10 of the case assembly 1. The instrument transformers of the plug-in unit 2 comprise three current transformers 3 and three voltage transformers 4. The coil former structures of the current transformers 3 and the voltage transformers 4 are different.

For each instrument transformer 3 and 4, the connector assembly 10 comprises a short-circuit element 5 having a basic state and two operational states. The short-circuit elements 5 are configured to operate together with the instrument transformers 3 and 4 such that the operational state of each short-circuit element 5 is determined based on whether it is an instrument transformer to be connected to the short-circuit element 5 when in its initial position, a current transformer 3 or a voltage transformer 4. When a current transformer 3 is connected to a short-circuit element 5 in the basic state, the short-circuit element 5 switches to an operational state wherein it shorts the current circuit when the plug-in unit 2 is being extracted, and wherein it opens the current circuit when the plug-in unit 2 is being inserted such that the current circuit circulates via the current transformer 3. Correspondingly, when a voltage transformer 4 is connected to a short-circuit element 5 in the basic state, the short-circuit element 5 switches to an operational state wherein it does not short the voltage circuit in any situation. Different types of instrument transformers rotate the short-circuit elements 5 in different directions from their basic state in accordance with FIG. 1.

The assembly of FIG. 1 is arranged such that the first time that the plug-in unit 2 is connected to the case assembly 1 causes changes in the connector assembly 10 of the case assembly 1, which in the future prevent such plug-in units 2 from being connected to the case assembly 1 that contain a combination of current transformers 3 and voltage transformers 4 that differs from what the plug-in unit 2 connected to the case assembly 1 the first time contained.

To prevent a plug-in unit 2 having the wrong type of instrument transformer combination from being connected, the short-circuit elements 5 of FIG. 1 are no longer restored to the basic state once they change over from it. For the same reason, the rotation of the short-circuit elements 5 farther than their operational position is prevented.

Alternatively, it is possible to achieve the plug-in unit assembly comprising instrument transformers according to the invention, wherein the plug-in unit 2 to be connected to the case assembly 1 for the first time does not code the case assembly 1, whereby the case assembly 1 also allows plug-in units 2 comprising different instrument transformer combinations to be connected thereto in the future. Such an arrangement may prove useful in special cases, wherein a given case assembly 1 is to be used with plug-in units 2 comprising a plurality of different instrument transformer combinations without the need to make changes in the connector assembly 10 of the case assembly 1 when switching to use the following plug-in unit 2. It is evident that in such solutions, the case assembly 1 has to be capable of identifying the types of the instrument transformers of the plug-in unit 2 each time the plug-in unit 2 is inserted into the case assembly 1, and to short the contacts corresponding to the current transformers 3 when the plug-in unit 2 is being detached.

Furthermore, it is possible to achieve the plug-in unit assembly comprising instrument transformers according to the invention, which is a kind of hybrid of two of the above-presented alternatives. Such an assembly operates otherwise essentially in the same way as the above-presented first assembly, but it additionally comprises special means for decoding the coding of the case assembly 1. An assembly provided with decoding means thus operates such that when the plug-in unit 2 is connected to the case assembly 1 for the first time, the connector assembly 10 of the case assembly 1 is coded to correspond to said plug-in unit 2, after which an other type of plug-in unit 2 can no longer be connected to the case assembly 1 without first decoding the coding of the connector assembly 10 by using the decoding means. After the decoding, a plug-in unit 2 provided with any kind of instrument transformer combination can be connected to the case assembly 1.

Figure 2:
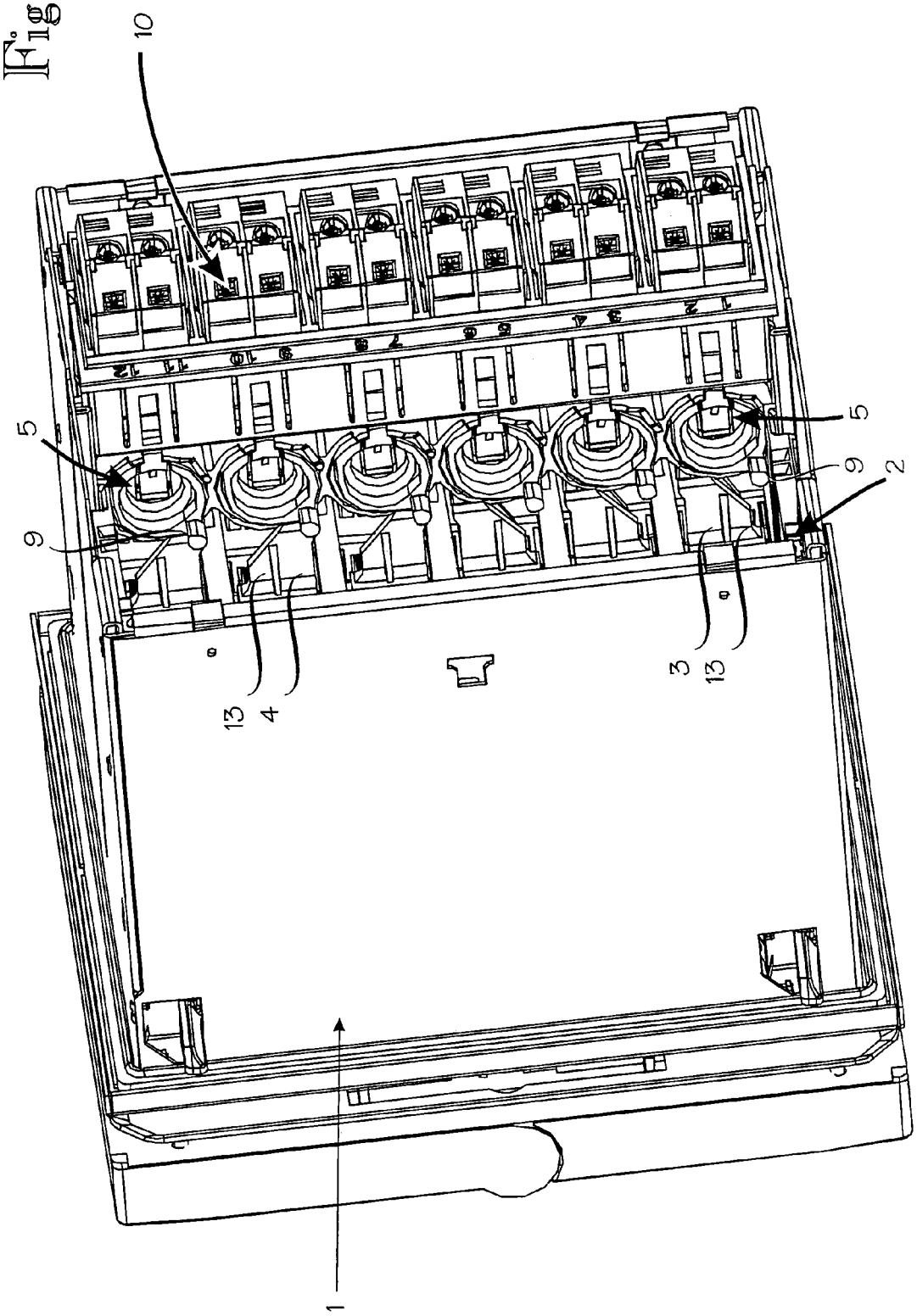
FIG. 2 shows a situation where the intention is to connect the plug-in unit of FIG. 1 to a case assembly whose connector assembly has been coded by the use of a plug-in unit provided with a different instrument transformer combination.

FIG. 2 shows a situation where the plug-in unit 2 of FIG. 1, comprising three current transformers 3 and three voltage transformers 4, is to be connected to a case assembly 1, whose connector assembly 10 is coded with a plug-in unit 2 comprising six current transformers 3. FIG. 2 shows that the insertion of the plug-in unit 2 into the case assembly 1 fails, since the coding brackets 13 of the three voltage transformers 4, seen on the right side in the figure, hit the rotating means 9 of the corresponding short-circuit elements 5.

In the assemblies shown in FIGS. 1 and 2, the rotating means 9 are used for both rotating the short-circuit elements 5 to the desired operational state and for preventing the insertion of a plug-in unit 2 having an instrument transformer combination of the wrong type into the case assembly 1. If desired, separate means can also be used for these purposes. In addition, when desired, the means used to prevent the coupling of a plug-in unit 2 comprising an instrument transformer combination of the wrong type may comprise means separate from the short-circuit element 5.

Figure 3:
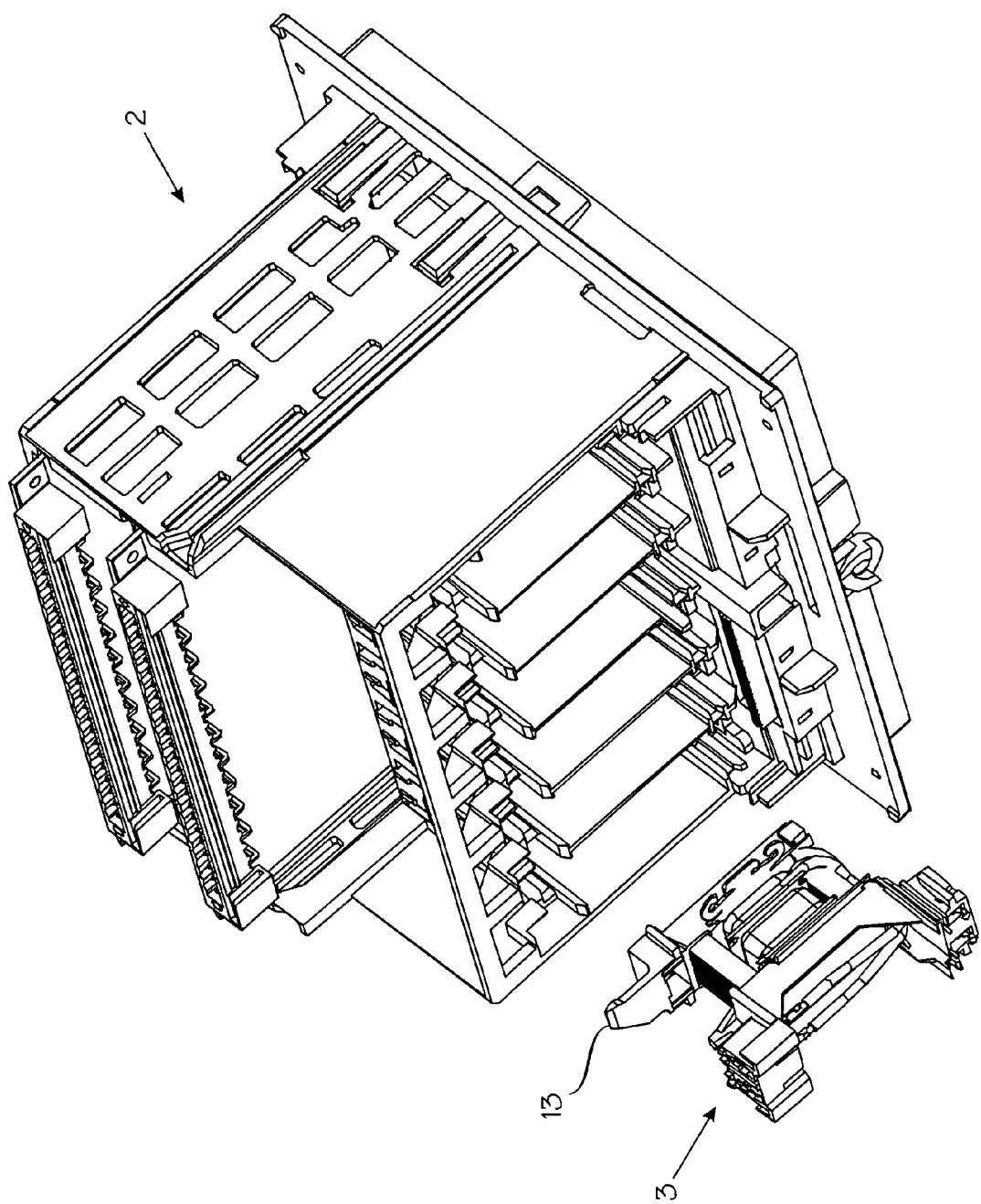
FIG. 3 shows the body of the plug-in unit of the assembly of FIG. 1 and an instrument transformer to be connected thereto.

FIG. 3 shows the body of the plug-in unit 2 of FIG. 1 and a current transformer 3 to be connected thereto. FIG. 3 shows that in the solution illustrated, the instrument transformer is inserted into a corresponding slot in the body of the plug-in unit 2 perpendicularly to the direction in which the plug-in unit 2 is configured for insertion into the case assembly 1.

Figure 4:
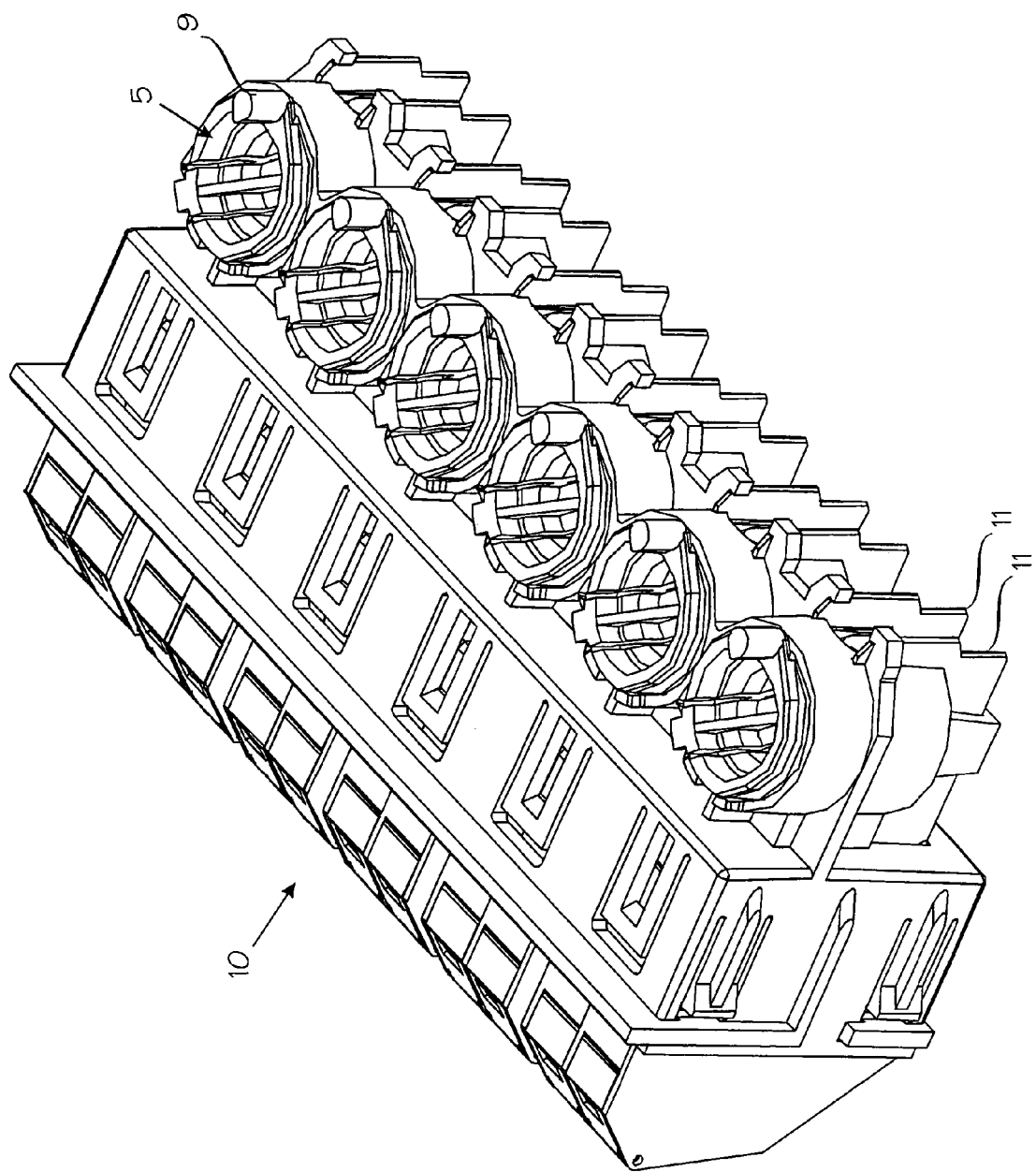
FIG. 4 shows the connector assembly of the assembly of FIG. 1.

FIG. 4 shows the connector assembly 10 of the case assembly 1 of FIG. 1. For each instrument transformer configured for connection thereto, the connector assembly 10 of FIG. 4 comprises a short-circuit element 5 and a pair of contacts 11, the first contact being adapted to be connected to the first terminal of the corresponding instrument transformer, and the second terminal being adapted to be connected to the second of the instrument transformer. In FIG. 4, all short-circuit elements 5 are in the basic state, all rotating means 9 of the short-circuit elements pointing in the same direction, i.e. in the direction from which the instrument transformers are configured to approach the short-circuit elements 5 when the plug-in unit 2 is being inserted into the case assembly 1.

The contacts of the pair of contacts 11 are naturally connected to contacts on the outer surface of the case assembly 1 in an electrically conductive manner, the contacts being configured for coupling to the desired voltage or current circuit.

The connector assembly 10 of the plug-in unit assembly of the invention comprising instrument transformers may comprise means for ensuring that the short-circuit elements 5 remain in their desired operational states. Such means are arranged specifically to prevent the unintentional transition of the short-circuit elements 5 from the desired operational states. Alternatively, the means for ensuring that the short-circuit elements 5 remain in the desired operational states may comprise means that are partly or entirely separate from the connector assembly 10.

Figure 5:
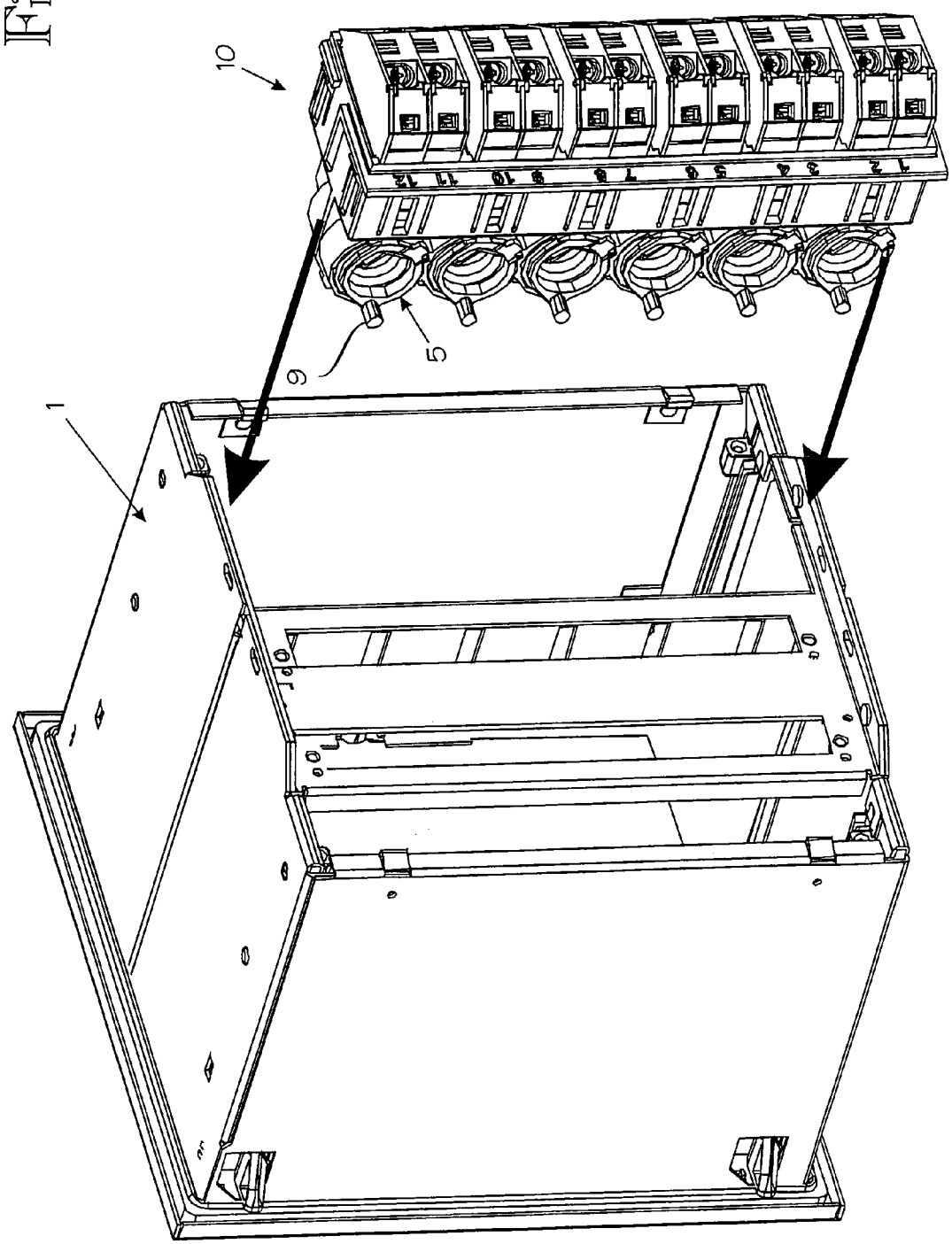
FIG. 5 shows the body of the case assembly of FIG. 1 and a connector assembly according to FIG. 4 to be connected thereto.

FIG. 5 shows the body of the case assembly 1 of FIG. 1 and the connector assembly 10 of FIG. 4 to be connected thereto. FIG. 5 shows that in the solution described, the connector assembly 10 is inserted into the body of the case assembly 1 from a direction opposite to the direction in which the plug-in unit 2 is configured for insertion into the case assembly 1.

FIGS. 6a to 6c show the structure of the short-circuit element 5 of the assembly of FIG. 1. The short-circuit element 5 comprises a substantially cylindrical body 6, a spring means 7, a short-circuit bit 8, which is configured to short the pair of contacts 11 corresponding to said short-circuit element 5 when needed and which the spring means 7 presses outwards from the body 6 in an operational state, and a rotating means 9 configured to rotate the short-circuit element 5 around the rotational axis of the cylindrical body 6.

The body 6 of the short-circuit element 5 of FIGS. 6a to 6c comprises a cavity 12 arranged to receive the spring means 7 and the short-circuit bit 8. In the example of FIGS. 6a to 6c, the spring means 7 is a helical spring to be placed in the cavity 12 of the body 6 of the short-circuit element 5, after which the short-circuit bit 8 is pushed in the radial direction of the body towards the spring means 7 and the midpoint of the body of the short-circuit element 5, whereby the spring means 7 is tensioned. However, it is evident that also another type of spring can be used as the spring means 7, such as for instance a flat spring. It is further evident that the spring means 7 and the short-circuit bit 8 do not necessarily have to be located in the cavity 12 of the body 6 of the short-circuit element 5.

The short-circuit element 5 shown in FIGS. 6a to 6c is configured to short the corresponding pair of contacts 11 such that in a situation where the orifice of the cavity 12 is substantially towards the imagined midline of the pair of contacts 11, the short-circuit bit 8 is allowed to move outwards from the cavity 12 pushed by the spring means 7, whereby the short-circuit bit 8 is coupled to both contacts of the pair of contacts 11 thus shorting said pair of contacts. The short-circuit bit 8 is coupled to the parts of the pair of contacts 11 that are directed upwards and located at the front in FIG. 4.

It is evident that to achieve the desired shorting properties, the short-circuit bit 8, or at least a given part of its surface, has to be electrically conductive.

The short-circuit element 5 connected to the voltage transformer 4 must not short the corresponding pair of contacts 11 in any situation. In the embodiment presented, said property is accomplished such that in an operational state corresponding to the voltage transformer 4, the short-circuit element 5 is rotated to a position where the cavity 12 of the short-circuit element 5 and the short-circuit bit 8 therein are directed away from the direction enabling shorting.

As was stated above, the short-circuit elements 5 are to short the pairs of contacts 11 corresponding to the current circuits only when no plug-in unit 2 is connected to the case assembly 1. In the embodiment presented, this property is implemented in such a manner that in an operational state corresponding to the current transformer 3, the short-circuit element 5 is rotated in a position where the spring means 7 pushes the short-circuit bit 8 substantially towards the imagined midline of the pair of contacts 11, and the coil body structure of the current transformers 3 is arranged such that when the current transformer 3 is connected to the connector assembly 10, its coil body structure pushes the short-circuit bit 8 deeper into the cavity 12 such that the short-circuit bit 8 reaches a position wherein it does not short the contacts of the pair of contacts 11. Correspondingly, in a situation wherein the plug-in unit 2 is detached from the case assembly 1 and the coil body structure of the current transformer 3 does not push the short-circuit bit 8 inwards, the short-circuit bit 8 of the short-circuit element 5 extends into a position wherein it shorts the contacts of the pair of contacts 11 corresponding to said short-circuit element 5.

In the short-circuit element 5 shown in FIG. 6, the rotating means 9 is a pin fastened at an end of the substantially cylindrical body 6 adjacent the edge, the longitudinal axis of the pin being substantially parallel to the axis of rotation of the cylindrical body 6.

It is evident that the implementation of the short-circuit element 5 may deviate from the one shown in FIG. 6. The rotating means 9 does not necessarily have to be pin-like or located at the end of the body of the short-circuit element 5. The rotating means 9 may be located for instance on a side surface of the short-circuit element 5 and be disc-like, for example. Furthermore, it is to be noted that, when desired, the body 6 of the short-circuit element 5 may have another shape than cylindrical. It is essential in the design of the short-circuit element 5 that it is capable of operating together with the instrument transformers 3 and 4 employed.

In the embodiment presented, the coding of the instrument transformers 3 and 4 is implemented by the coil body structures of the current transformers 3 and voltage transformers 4 being different. More exactly expressed, the coil body structure of the instrument transformers 3 and 4 of the embodiment presented comprises a coding bracket 13 having a front edge shaped like a bevelled rectangle. In the solution of the embodiment presented, the current transformers 3 and voltage transformers 4 are coded to differ from each other by bevelling the front edges of their coding brackets 13 at corners on different sides.

The instrument transformers may naturally be coded in another manner than the one presented above. An alternative manner of implementation is to provide those connector means with which each current transformer is connected to the connector assembly 10 with a structure enabling identification.

In the embodiment presented, the instrument transformers 3 and 4 are arranged to be placed in the plug-in unit 2 such that the front edge of the coding bracket 13 encounters the rotating means 9 of the short-circuit element 5 when the plug-in unit 2 is being inserted into the case assembly 1. FIG. 1 to 3 show that the front edges of the coding brackets 13 are bevelled so that the bevelled part extends to the midline of the coding bracket 13. Herein, the midline refers to the geometrical midline of the coding bracket 13 in a direction extending from the coil body to the front edge of the coding bracket 13. Since the coding brackets 13 of the current transformers 3 and the voltage transformers 4 are bevelled at different corners, the current transformers 3 and the voltage transformers 4 rotate the short-circuit elements 5 they encounter in different directions as is shown in FIG. 1.

As FIG. 1 in particular shows, the coding brackets 13 of the instrument transformers 3 and 4 are arranged to rotate the short-circuit elements 5 to positions corresponding to the types of the instrument transformers so that the bevelled part of each coding bracket 13 hits the rotating means 9 of the short-circuit element 5, whereby, when the instrument transformer and its coding bracket 13 are pushed further towards the short-circuit means, the bevelled part of the coding bracket 13 rotates the rotating means 9 in the direction of the bevelled edge. In order for the coding bracket 13 to hit the rotating means at the bevelled part, it is important in the solution of the embodiment presented that the front edge of the coding bracket 13 is bevelled at least up to the midline, as was mentioned above.

As was mentioned above, in the embodiment presented, when rotated to their operational state, the short-circuit elements 5 of the case assembly 1 prevent the insertion of a plug-in unit 2 having the wrong kind of instrument transformer combination into the case assembly. FIG. 2 shows that this preventive effect is based on the fact that the unbevelled parts of the front edges of the coding brackets 13 of the wrong type of instrument transformers hit the corresponding rotating means 9, whereby the plug-in unit 2 is unable to extend all the way to the bottom.

It is obvious to a person skilled in the art that the basic idea of the invention can be implemented in a variety of ways. The invention and its embodiments are thus not limited to the above examples, but may vary within the claims.

The invention claimed is:

1. A plug-in unit assembly comprising instrument transformers, including a case assembly comprising a connector assembly, and a plug-in unit comprising at least one instrument transformer and configured to be connected to the case assembly, whereby, when the plug-in unit is being inserted into the case assembly, said at least one instrument transformer is configured to be connected to the connector assembly and is selected from a set comprising current transformers and voltage transformers, wherein the set from which said at least one instrument transformer of the plug-in unit is selected is composed of instrument transformers coded in such a manner that the codings of the current transformers and the voltage transformers are different, and in that the connector assembly is capable of identifying the type of said at least one instrument transformer based on its coding when the plug-in unit is being connected to the case assembly, and wherein the assembly is arranged such that the connection of the plug-in unit for the first time to the case assembly achieves changes in the connector assembly which are based on a type identification carried out based on the coding of the instrument transformers, and which, when the plug-in unit connected to the case assembly is being detached from the case assembly, cause the connector assembly to short the current circuit corresponding to each current transformer and to leave open the voltage circuit corresponding to each voltage transformer.

2. An assembly as claimed in claim 1, wherein the coding of the different kinds of instrument transformers is implemented by the coil body structures of the current transformers and the voltage transformers being different from each other.

3. An assembly as claimed in claim 1, wherein the assembly is arranged such that when the plug-in unit is connected for the first time to the case assembly, changes occur in the connector assembly of the case assembly, which in the future prevent the connection of such a plug-in unit to the case assembly that comprises a different combination of current transformers and voltage transformers than did the plug-in unit that was connected to the case assembly for the first time.

4. A plug-in unit assembly comprising instrument transformers, including a case assembly comprising a connector assembly, and a plug-in unit comprising at least one instrument transformer and configured to be connected to the case assembly, whereby, when the plug-in unit is being inserted into the case assembly, said at least one instrument transformer is configured to be connected to the connector assembly and is selected from a set comprising current transformers and voltage transformers, wherein the set from which said at least one instrument transformer of the plug-in unit is selected is composed of instrument transformers coded in such a manner that the codings of the current transformers and the voltage transformers are different, and in that the connector assembly is capable of identifying the type of said at least one instrument transformer based on its coding when the plug-in unit is being connected to the case assembly, and the assembly is arranged such that when the plug-in unit is connected for the first time to the case assembly, changes occur in the connector assembly of the case assembly, which in the future prevent the connection of such a plug-in unit to the case assembly that comprises a different combination of current transformers and voltage transformers than did the plug-in unit that was connected to the case assembly for the first time, and wherein for each instrument transformer to be connected thereto, the connector assembly comprises a short-circuit element and a pair of contacts, the first contact being configured to be connected to a first terminal of the corresponding instrument transformer, and the second contact being configured to be connected to a second terminal of the instrument transformer, whereby, when the plug-in unit is connected for the first time to the case assembly, the short-circuit element corresponding to each voltage transformer switches to an operational state wherein it does not short the corresponding pair of contacts in any situation, whereas the short-circuit element corresponding to each current transformer switches to an operational state wherein it shorts the corresponding pair of contacts when the plug-in unit is being detached from the case assembly, and, correspondingly, when the plug-in unit is being connected to the case assembly, removes the short circuiting of the pair of contacts, allowing the current circuit to circulate via the current transformer.

5. An assembly as claimed in claim 4, wherein the body of the short-circuit element comprises a cavity configured to receive the spring means and the short-circuit bit at least partly.

6. A plug-in unit assembly comprising instrument transformers, including a case assembly comprising a connector assembly, and a plug-in unit comprising at least one instrument transformer and configured to be connected to the case assembly, whereby, when the plug-in unit is being inserted into the case assembly, said at least one instrument transformer is configured to be connected to the connector assembly and is selected from a set comprising current transformers and voltage transformers, wherein the set from which said at least one instrument transformer of the plug-in unit is selected is composed of instrument transformers coded in such a manner that the codings of the current transformers and the voltage transformers are different, and in that the connector assembly is capable of identifying the type of said at least one instrument transformer based on its coding when the plug-in unit is being connected to the case assembly, and the assembly is arranged such that when the plug-in unit is connected for the first time to the case assembly, changes occur in the connector assembly of the case assembly, which in the future prevent the connection of such a plug-in unit to the case assembly that comprises a different combination of current transformers and voltage transformers than did the plug-in unit that was connected to the case assembly for the first time, and wherein each short-circuit element comprises a substantially cylindrical body, a short-circuit bit configured to short the pair of contacts corresponding to said short-circuit element when necessary, a spring means configured to push the short-circuit bit outwards substantially in the radial direction of the body, and a rotating means configured to rotate the short-circuit element around the axis of rotation of the cylindrical body.

7. A plug-in unit assembly comprising instrument transformers, including a case assembly comprising a connector assembly, and a plug-in unit comprising at least one instrument transformer and configured to be connected to the case assembly, whereby, when the plug-in unit is being inserted into the case assembly, said at least one instrument transformer is configured to be connected to the connector assembly and is selected from a set comprising current transformers and voltage transformers, wherein the set from which said at least one instrument transformer of the plug-in unit is selected is composed of instrument transformers coded in such a manner that the codings of the current transformers and the voltage transformers are different, and in that the connector assembly is capable of identifying the type of said at least one instrument transformer based on its coding when the plug-in unit is being connected to the case assembly, and the coding of the different kinds of instrument transformers is implemented by the coil body structures of the current transformers and the voltage transformers being different from each other, and wherein the coil body structure of each instrument transformer comprises a coding bracket, which, seen from a given direction, is shaped like a rectangle whose one front corner is bevelled such that the bevelled part extends at least up to the imagined midline of the coding bracket.

* * * * *